United States Patent
Kim et al.

(10) Patent No.: US 8,659,265 B2
(45) Date of Patent: Feb. 25, 2014

(54) BATTERY PACK AND METHOD OF SENSING VOLTAGE OF BATTERY PACK

(75) Inventors: Jinwan Kim, Suwon-si (KR); Jongwoon Yang, Suwon-si (KR); Segawa Susumu, Suwon-si (KR); Testuya Okada, Suwon-si (KR); Euijeong Hwang, Suwon-si (KR); Sesub Sim, Suwon-si (KR); Hanseok Yun, Suwon-si (KR); Beomgyu Kim, Suwon-si (KR)

(73) Assignee: Samsung SDI Co., Ltd. (KR)

( * ) Notice: Subject to any disclaimer, the term of this patent is extended or adjusted under 35 U.S.C. 154(b) by 719 days.

(21) Appl. No.: 12/883,092

(22) Filed: Sep. 15, 2010

(65) Prior Publication Data

US 2011/0121837 A1    May 26, 2011

(30) Foreign Application Priority Data

Nov. 23, 2009    (KR) .................. 10-2009-0113135

(51) Int. Cl.
*H02J 7/00*    (2006.01)

(52) U.S. Cl.
USPC ............ 320/116; 320/119; 320/120; 320/122

(58) Field of Classification Search
CPC ...................................... Y02E 60/12
USPC ........................................ 320/116
See application file for complete search history.

(56) References Cited

U.S. PATENT DOCUMENTS

| | | | |
|---|---|---|---|
| 5,914,606 A * | 6/1999 | Becker-Irvin | ................. 324/434 |
| 6,268,710 B1 | 7/2001 | Koga | |
| 7,486,050 B2 | 2/2009 | Hidaka et al. | |
| 2009/0174563 A1 | 7/2009 | Cruise | |

FOREIGN PATENT DOCUMENTS

| | | | | |
|---|---|---|---|---|
| JP | 2001086656 | 3/2001 | | |
| JP | 2002-286766 | 10/2002 | | |
| JP | 2004-080949 | * 3/2004 | ............... | H02J 7/00 |
| JP | 2005-106504 | 4/2005 | | |
| JP | 2007-184135 | 7/2007 | | |
| JP | 2008224265 | 9/2008 | | |
| JP | 2008-259386 | 10/2008 | | |
| KR | 100814128 | 3/2008 | | |
| KR | 20080054901 | 6/2008 | | |

OTHER PUBLICATIONS

Office Action dated Apr. 17, 2012 in corresponding Japanese Patent Application No. 2010-135410.
European Search Report dated Feb. 21, 2011 in corresponding EP Application No. 10192195.5.

* cited by examiner

*Primary Examiner* — Edward Tso
*Assistant Examiner* — Ahmed Omar
(74) *Attorney, Agent, or Firm* — Knobbe Martens Olson & Bear LLP (57) ABSTRACT

A battery pack and a method of sensing a voltage of the battery pack are disclosed. The battery pack has more battery cells than an individual cell voltage sensing unit can sense the voltages of. The additional battery cells are sensed using a multi-cell voltage sensing unit and digital processing.

15 Claims, 5 Drawing Sheets

BATTERY PACK AND METHOD OF SENSING VOLTAGE OF BATTERY PACK

CROSS-REFERENCE TO RELATED APPLICATION

This application claims priority to and the benefit of Korean Patent Application No. 10-2009-0113135, filed on Nov. 23, 2009, the entire content of which is incorporated herein by reference.

BACKGROUND

1. Field

The technological field relates to a battery pack and a method of sensing a voltage of the battery pack.

2. Description of the Related Technology

In general, a battery pack includes a plurality of battery cells, a cell voltage sensing unit configured to sense voltages of the battery cells, and a control unit configured to use information obtained from the cell voltage sensing unit to prevent overcharge or overdischarge of the battery cells and to calculate capacity of the battery cells.

The cell voltage sensing unit is typically formed as a single integrated circuit (i.e., a single semiconductor chip), and designed to sense voltages of 1 to 4 battery cells that are connected in series. Also, the control unit is formed as a single integrated circuit (i.e., a single semiconductor chip), and is designed to communicate with the cell voltage sensing unit. The cell voltage sensing unit is typically referred to as an analog front end, and the control unit is typically referred to as a micro processing unit.

The maximum number of battery cells permitted by the single cell voltage sensing unit ranges from 1 to 4. However, in recent years, a battery pack provided with 5 or more battery cells connected in series is required. For example, a battery pack installed on electric tools for high capacity and large power requires 5 to 6 battery cells connected in series. Thus, to permit 5 battery cells, an additional expensive cell voltage sensing unit should be provided, or an additional complicated circuit should be designed since the maximum number of battery cells permitted by a single cell voltage sensing unit is just four as described above.

SUMMARY OF CERTAIN INVENTIVE ASPECTS

One aspect is a battery pack, which includes n+1 battery cells connected in series, an individual cell voltage sensing unit configured to sense voltages respectively of n battery cells of the n+1 battery cells, a multi-cell voltage sensing unit configured to sense a voltage of the n+1 battery cells, and a calculation unit configured to add the respective voltages obtained from the individual cell voltage sensing unit to determine a voltage of the n battery cells. The calculation unit is also configured to subtract the voltage of the n battery cells from the voltage of the n+1 battery cells obtained from the multi-cell voltage sensing unit to determine a voltage of the $n+1^{th}$ battery cell.

Another aspect is a battery pack including n+2 battery cells connected in series. The battery pack also includes an individual cell voltage sensing unit configured to sense voltages respectively of n battery cells of the n+2 battery cells, a multi-cell voltage sensing unit configured to sense a voltage of the n+1 battery cells and a voltage of the n+2 battery cells, and a calculation unit configured to add the respective voltages obtained from the individual cell voltage sensing unit to determine a voltage of the n battery cells. The calculation unit is also configured to subtract the voltage of the n battery cells from the voltage of the n+1 battery cells obtained from the multi-cell voltage sensing unit to determine a voltage of the $n+1^{th}$ battery cell, and configured to subtract the voltage of the n+1 battery cells from the voltage of the n+2 battery cells obtained from the multi-cell voltage sensing unit to determine a voltage of the $n+2^{th}$ battery cell.

Another aspect is a method of sensing a voltage of a battery pack. The method includes sensing voltages respectively of n battery cells, sensing a voltage of n+1 battery cells, adding the voltages of each of the n battery cells to determine a voltage of the n battery cells, and subtracting the voltage of the n battery cells from the voltage of the n+1 battery cells to determine a voltage of the $n+1^{th}$ battery cell.

Another aspect is a method of sensing a voltage of a battery pack. The method includes: sensing voltages respectively of n battery cells, sensing an entire voltage of n+1 battery cells, sensing an entire voltage of n+2 battery cells, adding the voltages respectively of the n battery cells to determine an entire voltage of the n battery cells, subtracting the entire voltage of the n battery cells from the entire voltage of the n+1 battery cells to determine a voltage of the $n+1^{th}$ battery cell, and subtracting the entire voltage of the n+1 battery cells from the entire voltage of the n+2 battery cells to determine a voltage of the $n+2^{th}$ battery cell.

BRIEF DESCRIPTION OF THE DRAWINGS

The above and other features and advantages will become more apparent to those of ordinary skill in the art by through the description of certain exemplary embodiments with reference to the attached drawings, in which.

DETAILED DESCRIPTION OF CERTAIN INVENTIVE EMBODIMENTS

Example embodiments will now be described more fully hereinafter with reference to the accompanying drawings; however, the various embodiments may be embodied in different ways and should not be construed as limiting the invention to the exemplary embodiments set forth herein. Rather, these embodiments are provided so that this disclosure will be thorough and complete.

Hereinafter, embodiments will be described in detail with reference to the accompanying drawings.

Figure 1:
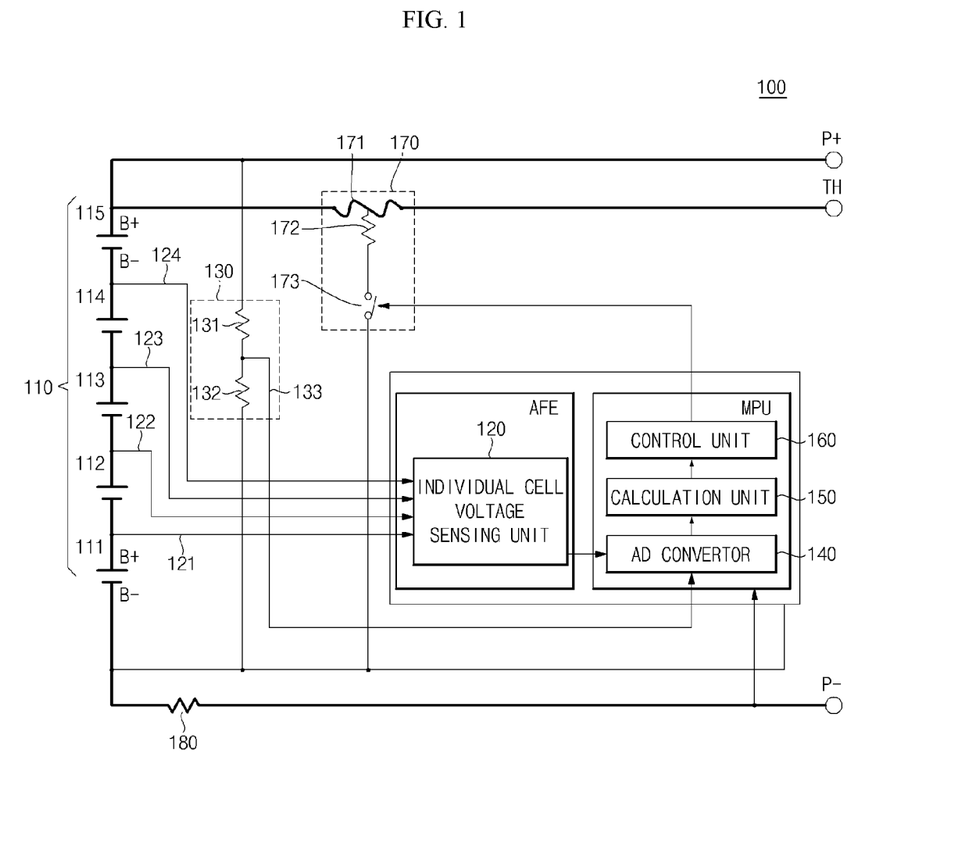
FIG. 1 is a block diagram illustrating a configuration of a battery pack according to an some embodiments.

FIG. 1 is a block diagram illustrating a configuration of a battery pack according to some embodiments.

Referring to FIG. 1, a battery pack 100 includes a plurality of battery cells 110, an individual cell voltage sensing unit 120, an multi-cell voltage sensing unit 130, an analog digital convertor 140, and a calculation unit 150. Furthermore, the battery pack 100 may include a control unit 160 and an overcharge prevention unit 170. In addition, the battery pack 100 further includes a pack positive terminal P+, a charge terminal TH, and a pack negative terminal P−. That is, the battery pack 100 is discharged through the pack positive terminal P+ and the pack negative terminal P−, and charged with a charging source through the charge terminal TH and the pack negative terminal P−.

The battery cell 110 includes n+1 battery cells 111, 112, 113, 114, and 115 that are connected in series. The battery cell 110 may be one of a typical lithium ion battery, a lithium polymer battery, and an equivalent thereof, but embodiments are not limited thereto. Here, n is a natural number. The voltages of the n battery cells 111, 112, 113, and 114 are sensed by the individual cell voltage sensing unit 120, but the n+1$^{th}$ battery cell 115 is not sensed by the individual cell voltage sensing unit 120. That is, the individual cell voltage sensing unit 120 is formed as an integrated circuit that is typically connected to sense the voltages of the n battery cells 111, 112, 113, and 114. Thus, the individual cell voltage sensing unit 120 cannot sense the additional voltage of the n+1$^{th}$ battery cell 115. Each of the n+1 battery cells 111, 112, 113, 114, and 115 includes a cell positive terminal B+ and a cell negative terminal B−. As a matter of course, a battery cell may be connected in parallel to each of the n+1 battery cells 111, 112, 113, 114, and 115.

The individual cell voltage sensing unit 120 is connected to each of the n battery cells 111, 112, 113, and 114 through sensing wires 121, 122, 123, and 124 to sense the voltages of the n battery cells 111, 112, 113, and 114. For example, the n battery cells 111, 112, 113, and 114 require the n sensing wires 121, 122, 123, and 124. Since the individual cell voltage sensing unit 120 is typically formed as an integrated circuit, and processes analog signals, the individual cell voltage sensing unit 120 may be referred to as an analog front end.

The multi-cell voltage sensing unit 130 includes a first resistor 131 and a second resistor 132 to sense the cell voltage of the n+1 battery cells 111, 112, 113, 114, and 115 (i.e., the voltage across the n+1 battery cells 111, 112, 113, 114, and 115). In this embodiment, the first and second resistors 131 and 132 of the multi-cell voltage sensing unit 130 are connected in series to each other between the negative terminal B− of the battery cell 111 having the lowest potential and the positive terminal B+ of the battery cell 115 having the highest potential. In addition, a divided voltage line 133 is connected to a node between the first and second resistors 131 and 132 to output a divided voltage. The divided voltage line 133 is connected to the analog digital convertor 140.

The analog digital convertor 140 is electrically connected to the individual cell voltage sensing unit 120 and the multi-cell voltage sensing unit 130. The analog digital convertor 140 converts analog voltages of the n battery cells 111, 112, 113, and 114 applied from the individual cell voltage sensing unit 120 to digital values, and outputs the digital values. In addition, the analog digital convertor 140 converts an analog voltage of the n+1 battery cells 111, 112, 113, 114, and 115 applied from the multi-cell voltage sensing unit 130 to a digital value, and outputs the digital value.

The calculation unit 150 is electrically connected to the analog digital convertor 140. The calculation unit 150 receives voltage information of each of the n battery cells 111, 112, 113, and 114 from the analog digital convertor 140. In addition, the calculation unit 150 receives voltage information of the n+1 battery cells 111, 112, 113, 114, and 115 from the analog digital convertor 140. The calculation unit 150 adds the voltages of the n battery cells 111, 112, 113, and 114 to determine a voltage of the n battery cells 111, 112, 113, and 114. Then, the calculation unit 150 subtracts the voltage of the n battery cells 111, 112, 113, and 114 from a voltage of the n+1 battery cells 111, 112, 113, 114, and 115 to determine a voltage of the n+1$^{th}$ battery cell 115. Thus, according to some embodiments, without an additional circuit (e.g., a fly capacitor circuit and a charge pump circuit) for additionally sensing a voltage of the individual cell voltage sensing unit 120 or a voltage of the n+1$^{th}$ battery cell 115, software or firmware is used to accurately sense and determine a voltage of the n+1$^{th}$ battery cell 115. This method is particularly useful when the individual cell voltage sensing unit 120 is connected to sense only voltages of the n battery cells 111, 112, 113, and 114. Accordingly, when a battery pack manufacturer designs the battery pack 100 including the n+1 battery cells 111, 112, 113, 114, and 115, a voltage of the n+1$^{th}$ battery cell 115 can be effectively sensed and determined by just modifying software or firmware without adding an additional voltage sensing circuit.

The control unit 160 receives the voltage information of each of the n battery cells 111, 112, 113, and 114, the voltage information of the n+1$^{th}$ battery cell 115, and the voltage information of the n+1 battery cells 111, 112, 113, 114, and 115 from the calculation unit 150. When any of the voltages of the n battery cells 111, 112, 113, and 114, the n+1$^{th}$ battery cell 115, and the voltage of the n+1 battery cells 111, 112, 113, 114, and 115 is greater than a reference voltage, the control unit 160 outputs a charge stop signal.

The analog digital convertor 140, the calculation unit 150, and the control unit 160 may be referred to as a micro processing unit, and be formed as a single integrated circuit. Furthermore, the analog front end and the micro processing unit may be formed as a single integrated circuit, for example, as a single semiconductor chip. In FIG. 1, the analog front end and the micro processing unit is illustrated as a single semiconductor chip.

The overcharge prevention unit 170 includes a fuse 171, a heating resistor 172, and a switch 173. The fuse 171 is connected between the positive terminal B+ of the battery cell 115 having the highest potential and the charge terminal TH. The heating resistor 172 is connected to the fuse 171. The switch 173 is connected between the heating resistor 172 and the negative terminal B− of the battery cell 111 having the lowest potential. The switch 173 is controlled by the control unit 160. Accordingly, when the control unit 160 outputs a charge stop signal, the switch 173 is turned on. Then, a current flows from the charge terminal TH or the positive terminal B+ of the battery cell 115 having the highest potential to the pack negative terminal P− or the negative terminal B− of the battery cell 111 having the lowest potential through the fuse 171, the heating resistor 172, and the switch 173. Thus, a large amount of heat is generated from the heating resistor 172, and the heat cuts off the fuse 171, thus preventing overcharge of the n+1 battery cells 111, 112, 113, 114, and 115.

A current sensor 180 senses a current flowing from the n+1 battery cells 111, 112, 113, 114, and 115. The current sensor 180 is electrically connected (not shown) to at least one of the analog front end and the micro processing unit, so that at least one of the analog front end and the micro processing unit can sense a current flowing from the n+1 battery cells 111, 112, 113, 114, and 115. Since the current sensor 180 and the operation thereof are well know to those skilled in the art, a description thereof will be omitted.

Figure 2:
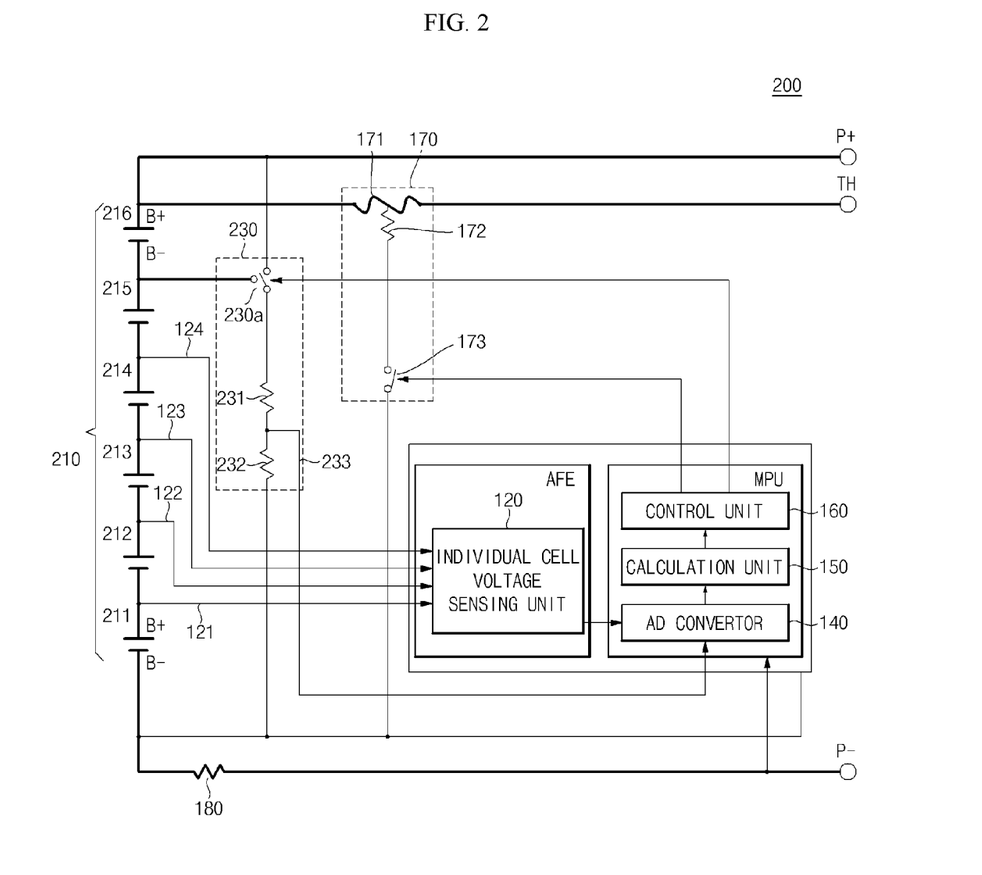
FIG. 2 is a block diagram illustrating a configuration of a battery pack according to some embodiments.

FIG. 2 is a block diagram illustrating a configuration of a battery pack according to some embodiments.

As illustrated in FIG. 2, a battery pack 200 has the similar configuration to that of the battery pack 100. Thus, differences between the battery packs 100 and 200 will be described.

Referring to FIG. 2, battery cells 210 includes n+2 battery cells 211, 212, 213, 214, 215, and 216 that are connected in series. Here, the voltages of the n battery cells 211, 212, 213, and 214 are sensed by the individual cell voltage sensing unit 120, but the n+1$^{th}$ battery cell 215 and n+2$^{th}$ battery cell 216 are not sensed by the individual cell voltage sensing unit 120. That is, the individual cell voltage sensing unit 120 is connected to sense the voltages of the n battery cells 211, 212, 213, and 214. Thus, the individual cell voltage sensing unit 120 cannot sense the voltages of the n+1$^{th}$ battery cell 115 and n+2$^{th}$ battery cell 216. Each of the n+2 battery cells 211, 212, 213, 214, 215, and 216 includes a cell positive terminal B+ and a cell negative terminal B−. A battery cell may be connected in parallel to any of the n+2 battery cells 211, 212, 213, 214, 215, and 216.

A cell voltage sensing unit 230 includes a three-terminal switch 230a, a first resistor 231, and a second resistor 232 to sense a voltage of the n+2 battery cells 211, 212, 213, 214, 215, and 216. The three-terminal switch 230a is connected to the positive terminal B+ of the n+1$^{th}$ battery cell 215, the positive terminal B+ of the n+2$^{th}$ battery cell 216, and the first resistor 231. One terminal of the three-terminal switch 230a is connected to the first resistor 231 all the times, and the one terminal is selectively shorted by the switch to the positive terminal B+ of the n+1$^{th}$ battery cell 215 or the positive terminal B+ of the n+2$^{th}$ battery cell 216. The first resistor 231 is connected to the three-terminal switch 230a, and the second resistor 232 is connected between the first resistor 231 and the negative terminal B− of the battery cell 211 having the lowest potential. A divided voltage line 233 is connected to a node between the first and second resistors 231 and 232 to output a divided voltage. The divided voltage line 233 is connected to the analog digital convertor 140.

The control unit 160 controls the three-terminal switch 230a. That is, to sense a voltage of the n+1 battery cells 211, 212, 213, 214, and 215, the control unit 160 outputs a first switch control signal such that the three-terminal switch 230a connects the positive terminal B+ of the n+1$^{th}$ battery cell 215 to the first resistor 231. The voltage of the n+1 battery cells 211, 212, 213, 214, and 215 is converted into a divided voltage by the first and second resistors 231 and 232, and the divided voltage is input to the analog digital convertor 140 through the divided voltage line 233. Thereafter, to sense a voltage of the n+2 battery cells 211, 212, 213, 214, and 215, the control unit 160 outputs a second switch control signal such that the three-terminal switch 230a connects the positive terminal B+ of the n+2$^{th}$ battery cell 216 to the first resistor 231. Then, the voltage of the n+2 battery cells 211, 212, 213, 214, 215, and 216 is converted into a divided voltage by the first and second resistors 231 and 232, and the divided voltage is input to the analog digital convertor 140 through the divided voltage line 233.

The calculation unit 150 receives voltage information of each of the n battery cells 210 from the analog digital convertor 140. The voltage information of each of the n battery cells 210 is delivered from the individual cell voltage sensing unit 120 to the analog digital convertor 140.

In addition, the calculation unit 150 receives voltage information of the n+1 battery cells 211, 212, 213, 214, and 215, and voltage information of the n+2 battery cells 211, 212, 213, 214, 215, and 216 from the analog digital convertor 140.

The calculation unit 150 adds voltage values of the n battery cells 211, 212, 213, and 214 to determine the voltage of the n battery cells 211, 212, 213, and 214.

The calculation unit 150 subtracts the voltage of the n battery cells 211, 212, 213, and 214 from the voltage of the n+1 battery cells 211, 212, 213, 214, and 215 to determine a voltage of the n+1$^{th}$ battery cell 215.

In addition, the calculation unit 150 subtracts the voltage of the n+1 battery cells 211, 212, 213, 214, and 215 from the voltage of the n+2 battery cells 211, 212, 213, 214, 215, and 216 to determine a voltage of the n+2$^{th}$ battery cell 216.

Therefore, according to the current embodiment, the three-terminal switch 230a is hardware, and software or firmware may be modified to accurately sense and determine a voltage of the n+1$^{th}$ battery cell 215 and a voltage of the n+2$^{th}$ battery cell 216.

In the above described manner, voltages respectively of n+m battery cells can be sensed and determined. Here, 2≤m, and in some embodiments, m≤n−1, where n and m are natural numbers. That is, when n is 4, voltages of added two, three or more battery cells can be sensed using switches of a corresponding minimum number of terminals. In some embodiments, when four battery cells are added in the state where n is 4, an individual cell voltage sensing unit may be added instead of the current embodiment.

Figure 3:
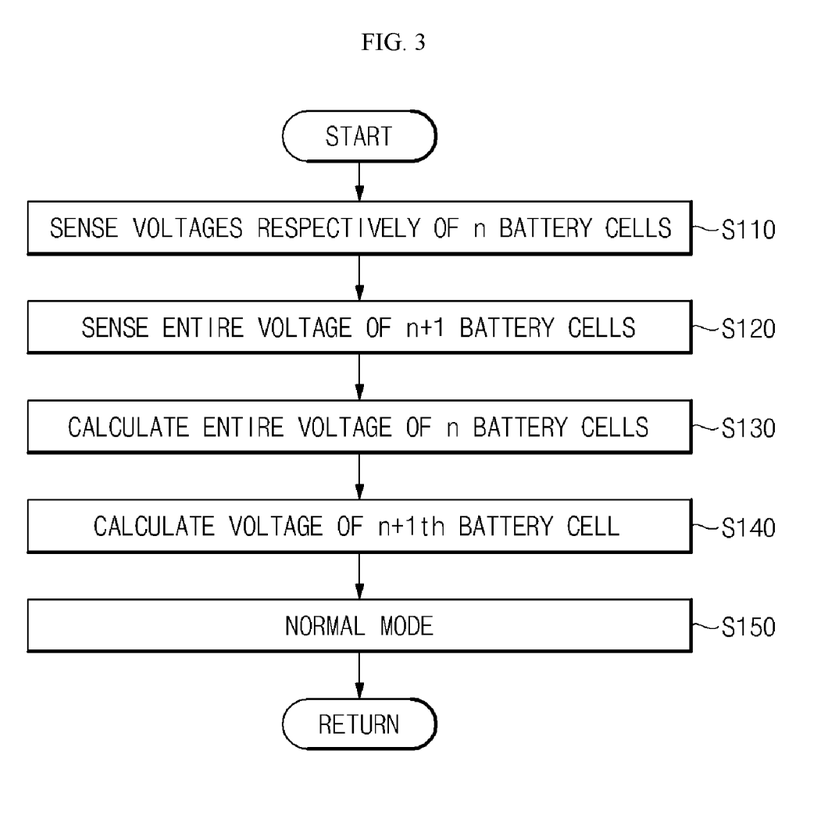
FIG. 3 is a flowchart illustrating a method of sensing a voltage of a battery pack according to some embodiments.

FIG. 3 is a flowchart illustrating a method of sensing a voltage of a battery pack according to some embodiments.

Referring to FIG. 3, a method of sensing a voltage of the battery pack 100 includes sensing voltages respectively of n battery cells in operation S110, sensing a voltage of n+1 battery cells in operation S120, adding the voltages respectively of the n battery cells to determine a voltage of the n battery cells in operation S130, and subtracting the voltage of the n battery cells from the voltage of the n+1 battery cells to determine a voltage of the n+1$^{th}$ battery cell in operation S140. In some embodiments, the battery pack may be in a measurement mode when determining battery cell voltages, and may switch to a normal mode S150 after operation S140.

Operations S110, S120, S130, S140, and S150 are performed by the calculation unit 150 and the control unit 160. That is, various calculations are performed by the calculation unit 150, and the individual cell voltage sensing unit 120. The multi-cell voltage sensing unit 130, and the analog digital convertor 140 are controlled by the control unit 160. The order of operations S110, S120, S130, S140, and S150 can be varied.

In sensing the voltages respectively of n battery cells in operation S110, the individual cell voltage sensing unit 120 and the n sensing wires 121, 122, 123, and 124 connected to the n battery cells 111, 112, 113, and 114 are used to sense voltages respectively of the n battery cells 111, 112, 113, and 114. The voltages respectively of the n battery cells 111, 112, 113, and 114 are converted to digital values with the analog digital convertor 140.

In sensing a voltage of n+1 battery cells in operation S120, the multi-cell voltage sensing unit 130 is used to sense a voltage of the n+1 battery cells 111, 112, 113, 114, and 115. The voltage of the n+1 battery cells 111, 112, 113, 114, and 115 is converted to a digital value with the analog digital convertor 140.

In adding the voltages respectively of the n battery cells to determine a voltage of the n battery cells in operation S130, the voltages respectively of the n battery cells 111, 112, 113, and 114 input through the analog digital convertor 140 are added to determine a voltage of the n battery cells 111, 112, 113, and 114.

In determining a voltage of the n+1$^{th}$ battery cell in operation S140, the voltage of the n battery cells 111, 112, 113, and 114 is subtracted from the voltage of the n+1 battery cells 111, 112, 113, 114, and 115 to determine a voltage of the n+1$^{th}$ battery cell 115.

The device may enter the normal mode in operation S150 after operation S140.

Figure 4:
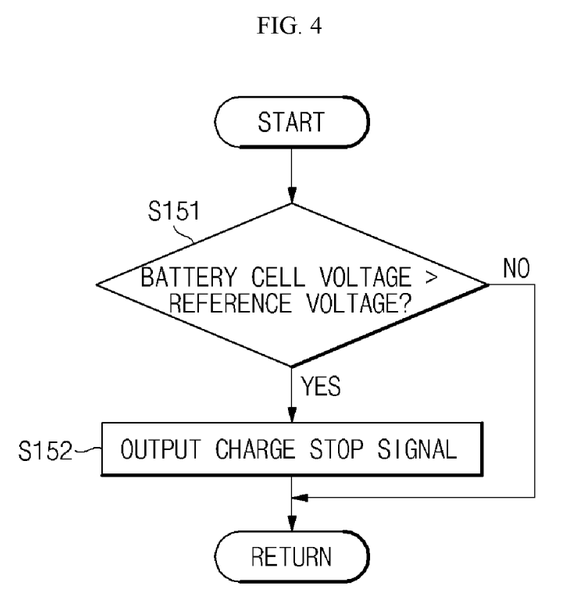
FIG. 4 is a flowchart illustrating an operation of a normal mode of the method of FIG. 3.

FIG. 4 is a flowchart illustrating an operation of the normal mode of the method of FIG. 3.

Referring to FIG. 4, the normal mode includes determining whether a battery cell voltage is greater than a reference voltage in operation S151, and outputting a charge stop signal in operation S152. Operations S151 and S152 are performed by the control unit 160.

In determining whether a battery cell voltage is greater than a reference voltage in operation S151, it is determined whether the voltages respectively of the n+1 battery cells 111, 112, 113, 114, and 115 are greater than a reference voltage (e.g., about 4.3 V). When the voltages respectively of one or more of the n+1 battery cells 111, 112, 113, 114, and 115 is greater than the reference voltage, a charge stop signal is output to the switch 173. As a result, the switch 173 is turned on, and the fuse 171 connected between the positive terminal B+ of the n+1$^{th}$ battery cell 115 and the charge terminal TH is opened, thus preventing overcharge of the n+1 battery cells 111, 112, 113, 114, and 115.

Figure 5:
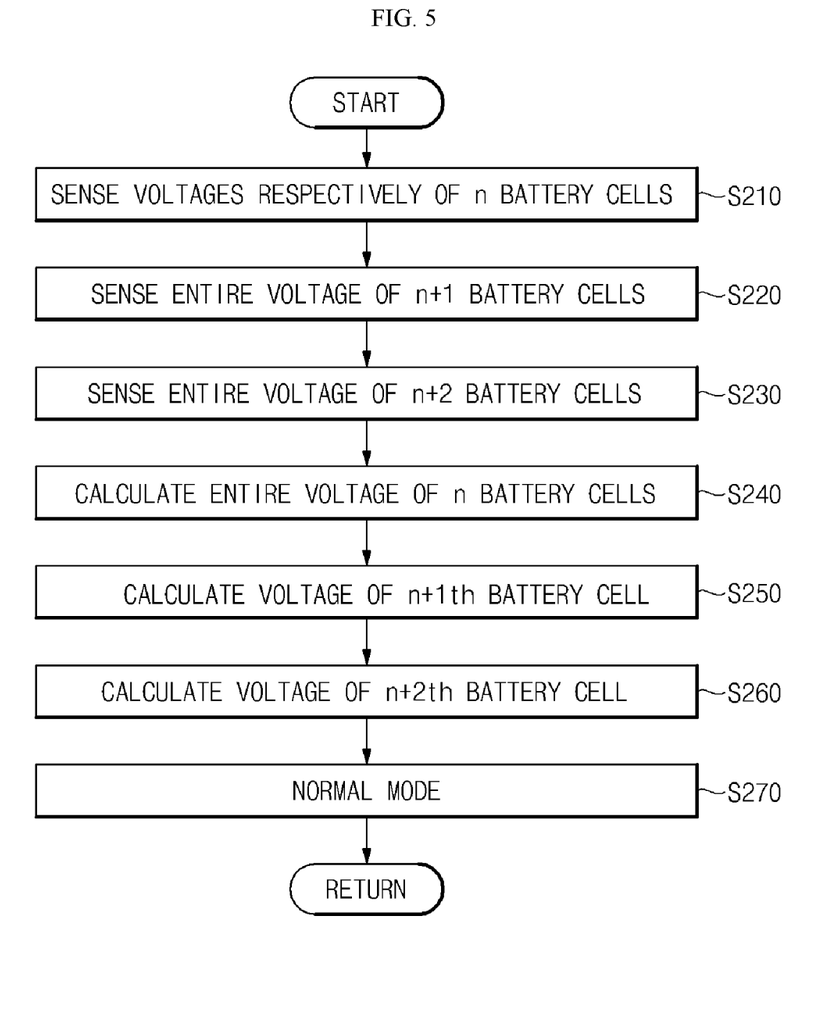
FIG. 5 is a flowchart illustrating a method of sensing a voltage of a battery pack according to some embodiments.

FIG. 5 is a flowchart illustrating a method of sensing a voltage of a battery pack according to another embodiment.

Referring to FIG. 5, a method of sensing a voltage of the battery pack 200 includes sensing voltages respectively of n battery cells in operation S210, sensing a voltage of n+1 battery cells in operation S220, sensing a voltage of n+2 battery cells in operation S230, adding the voltages respectively of the n battery cells to determine a voltage of the n battery cells in operation S240, subtracting the voltage of the n battery cells from the voltage of the n+1 battery cells to determine a voltage of the n+1$^{th}$ battery cell in operation S250, and subtracting the voltage of the n+1 battery cells from the voltage of the n+2 battery cells to determine a voltage of the n+2$^{th}$ battery cell in operation S260.

Here, operations S210, S220, S230, S240, S250, and S260 are performed by the calculation unit 150 and the control unit 160. That is, various calculations are performed by the calculation unit 150, and the individual cell voltage sensing unit 120, the multi-cell voltage sensing unit 130, and the analog digital convertor 140 are controlled by the control unit 160. The order of operations S210, S220, S230, S240, S250, and S260 can be varied.

In sensing voltages respectively of n battery cells in operation S210, the individual cell voltage sensing unit 120 and the n sensing wires 121, 122, 123, and 124 connected to the n battery cells 211, 212, 213, and 214 are used to sense voltages respectively of the n battery cells 211, 212, 213, and 214. As a matter of course, the voltages respectively of the n battery cells 211, 212, 213, and 214 are converted to digital values through the analog digital convertor 140.

In sensing a voltage of n+1 battery cells in operation S220, the multi-cell voltage sensing unit 230 is used to sense a voltage of the n+1 battery cells 211, 212, 213, 214, and 215. That is, the three-terminal switch 230a is used to connect the positive terminal B+ of the n+1$^{th}$ battery cell 215 to the first resistor 231, and then, divided voltages due to the first and second resistors 231 and 232 are transmitted to the analog digital convertor 140 through the divided voltage line 233, so as to sense the voltage of the n+1 battery cells 211, 212, 213, 214, and 215. The voltage of the n+1 battery cells 211, 212, 213, 214, and 215 is converted to a digital value through the analog digital convertor 140.

In sensing a voltage of n+2 battery cells in operation S230, the multi-cell voltage sensing unit 230 is used to sense a voltage of the n+2 battery cells 211, 212, 213, 214, 215, and 216. That is, the three-terminal switch 230a is used to connect the positive terminal B+ of the n+2$^{th}$ battery cell 216 to the first resistor 231, and the divided voltage from the first and second resistors 231 and 232 is transmitted to the analog digital convertor 140 through the divided voltage line 233, so as to sense the voltage of the n+2 battery cells 211, 212, 213, 214, 215, and 216. The voltage of the n+2 battery cells 211, 212, 213, 214, 215, and 216 is converted to a digital value with the analog digital convertor 140.

In adding the voltages respectively of the n battery cells to determine a voltage of the n battery cells in operation S240, the voltages respectively of the n battery cells 211, 212, 213, and 214 input through the analog digital convertor 140 are added to determine a voltage of the n battery cells 211, 212, 213, 214.

In determining a voltage of the n+1$^{th}$ battery cell in operation S250, the voltage of the n battery cells 211, 212, 213, and 214 is subtracted from the voltage of the n+1 battery cells 211, 212, 213, 214, and 215 to determine a voltage of the n+1$^{th}$ battery cell 215.

In determining a voltage of the n+2$^{th}$ battery cell in operation S260, the voltage of the n+1 battery cells 211, 212, 213, 214, and 215 is subtracted from the voltage of the n+2 battery cells 211, 212, 213, 214, 215, and 216 to determine a voltage of the n+2$^{th}$ battery cell 216.

In some embodiments, the battery pack may be in a measurement mode when determining battery cell voltages, and may switch to a normal mode S150 after operation S140.

In some embodiments, the battery pack may be in a measurement mode when determining battery cell voltages, and may switch to a normal mode in operation S270 after operation S260. In some embodiments, operation S270 is substantially the same as operation S150.

According to the method of FIG. 5, voltages respectively of the n battery cells are sensed, a voltage of the n+1 battery cells is sensed, and then, a voltage of the n battery cells is subtracted from the voltage of the n+1 battery cells, thereby accurately sensing a voltage of the n+1$^{th}$ battery cell. Thus, a voltage of the n+1$^{th}$ battery cell can be sensed and determined without adding an additional cell voltage sensing circuit or an additional complicated and/or expensive circuit.

According to the method of FIG. 5, voltages respectively of the n battery cells are sensed, voltages of the n+1 battery cells and the n+2 battery cells are sensed using the three-terminal switch, a voltage of the n battery cells is subtracted from the voltage of the n+1 battery cells to sense a voltage of the n+1$^{th}$ battery cell, and the voltage of the n+1 battery cells is subtracted from the voltage of the n+2 battery cells to sense a voltage of the n+2$^{th}$ battery cell. Thus, a voltage of the n+1$^{th}$ battery cell and a voltage of n+1$^{th}$ battery cell can be sensed and determined using the simple three-terminal switch.

Exemplary features of embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made to the features or embodiments.

What is claimed is:
1. A battery pack, comprising:
n+1 battery cells connected in series;
an individual cell voltage sensing unit configured to sense voltages respectively of
n battery cells of the n+1 battery cells;
a multi-cell voltage sensing unit configured to sense a voltage of the n+1 battery cells; and
a calculation unit configured to add the respective voltages obtained from the individual cell voltage sensing unit to determine a voltage of the n battery cells, and configured to subtract the voltage of the n battery cells from the voltage of the n+1 battery cells obtained from the multi-cell voltage sensing unit to determine a voltage of the n+1th battery cell, wherein the individual cell voltage sensing unit is formed as an integrated circuit chip, and wherein the multi-cell voltage sensing unit is directly connected to an analog digital converter.

2. The battery pack as claimed in claim 1, wherein n is a natural number.

3. The battery pack as claimed in claim 1, wherein the individual cell voltage sensing unit and the multi-cell voltage sensing unit are each connected to the analog digital converter configured to convert an analog voltage value to a digital voltage value.

4. The battery pack as claimed in claim 3, wherein the analog digital converter is configured to transmit voltage values respectively of the n battery cells and a voltage value of the n+1 battery cells to the calculation unit.

5. The battery pack as claimed in claim 3, wherein
the multi-cell voltage sensing unit comprises a first resistor and a second resistor that are connected in series between a positive terminal of the battery cell having a highest potential and a negative terminal of the battery cell having a lowest potential, and
divided voltages of the voltage of the n+1 battery cells by the first and second resistors are input to the analog digital converter.

6. A battery pack comprising:
n+2 battery cells connected in series;
an individual cell voltage sensing unit configured to sense voltages respectively of n battery cells of the n+2 battery cells;
a multi-cell voltage sensing unit configured to sense a voltage of the n+1 battery cells and a voltage of the n+2 battery cells; and
a calculation unit configured to add the respective voltages obtained from the individual cell voltage sensing unit to determine a voltage of the n battery cells, configured to subtract the voltage of the n battery cells from the voltage of the n+1 battery cells obtained from the multi-cell voltage sensing unit to determine a voltage of the n+1th battery cell, and configured to subtract the voltage of the n+1 battery cells from the voltage of the n+2 battery cells obtained from the multi-cell voltage sensing unit to determine a voltage of the n+2th battery cell,
wherein the individual cell voltage sensing unit is formed as an integrated circuit chi and wherein the multi-cell voltage sensing unit is directly connected to an analog digital converter.

7. The battery pack as claimed in claim 6, wherein n is a natural number.

8. The battery pack as claimed in claim 6, wherein the individual cell voltage sensing unit and the multi-cell voltage sensing unit are each connected to the analog digital converter configured to convert an analog voltage value to a digital voltage value.

9. The battery pack as claimed in claim 8, wherein the analog digital converter is configured to transmit voltage values respectively of the n battery cells, a voltage value of the n+1 battery cells, and a voltage value of the n+2 battery cells to the calculation unit.

10. The battery pack as claimed in claim 8, wherein:
the multi-cell voltage sensing unit comprises a first resistor and a second resistor that are connected in series to each other between a positive terminal of the battery cell having a highest potential and a negative terminal of the battery cell having a lowest potential, and
divided voltages of the voltage of the n+1 battery cells and divided voltages of the voltage of the n+2 battery cells from the first and second resistors are input to the analog digital converter.

11. The battery pack as claimed in claim 10, wherein:
a three-terminal switch is connected to a positive terminal of the n+1th battery cell, a positive terminal of the n+2th battery cell, and to the first resistor, and
the three-terminal switch is controlled by a control unit.

12. The battery pack as claimed in claim 11, wherein, the control unit controls the three-terminal switch to connect the positive terminal of the n+1th battery cell to the first resistor to sense the voltage of the n+1 battery cells.

13. The battery pack as claimed in claim 11, wherein, the control unit controls the three-terminal switch to connect the positive terminal of the n+2th battery cell to the first resistor to sense the voltage of the n+2 battery cells.

14. A method of sensing a voltage of a battery pack, the method comprising:
sensing voltages respectively of n battery cells using an individual cell voltage sensing unit;
sensing a voltage of n+1 battery cells using a multi-cell voltage sensing unit;
adding the voltages of each of the n battery cells to determine a voltage of the n battery cells; and
subtracting the voltage of the n battery cells from the voltage of the n+1 battery cells to determine a voltage of the n+1th battery cell,
wherein the individual cell voltage sensing unit is formed as an integrated circuit chi and wherein the multi-cell voltage sensing unit is directly connected to an analog digital converter.

15. A method of sensing a voltage of a battery pack, the method comprising:
sensing voltages respectively of n battery cells using an individual cell voltage sensing unit;
sensing an entire voltage of n+1 battery cells using a multi-cell voltage sensing unit;
sensing an entire voltage of n+2 battery cells;
adding the voltages respectively of the n battery cells to determine an entire voltage of the n battery cells;
subtracting the entire voltage of the n battery cells from the entire voltage of the n+1 battery cells to determine a voltage of the n+1th battery cell; and
subtracting the entire voltage of the n+1 battery cells from the entire voltage of the n+2 battery cells to determine a voltage of the n+2th battery cell,
wherein the individual cell voltage sensing unit is formed as an integrated circuit chip, and wherein the multi-cell voltage sensing unit is directly connected to an analog digital converter.

* * * * *

UNITED STATES PATENT AND TRADEMARK OFFICE
CERTIFICATE OF CORRECTION

PATENT NO. : 8,659,265 B2  
APPLICATION NO. : 12/883092  
DATED : February 25, 2014  
INVENTOR(S) : Jinwan Kim et al.

Page 1 of 1

It is certified that error appears in the above-identified patent and that said Letters Patent is hereby corrected as shown below:

In the Specification:

At column 4, line 55, please delete "know", and insert --known--, therefor.

In the Claims:

At column 9, line 44, claim 6, please delete "chi", and insert --chip--, therefor.

At column 10, line 36, claim 14, please delete "chi", and insert --chip--, therefor.

Signed and Sealed this  
Second Day of September, 2014

Michelle K. Lee  
*Deputy Director of the United States Patent and Trademark Office*